(12) United States Patent
Reznik

(10) Patent No.: US 6,781,057 B2
(45) Date of Patent: Aug. 24, 2004

(54) ELECTRICAL ARRANGEMENT AND METHOD FOR PRODUCING AN ELECTRICAL ARRANGEMENT

(75) Inventor: Daniel Reznik, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/722,311

(22) Filed: Nov. 25, 2003

(65) Prior Publication Data

US 2004/0144554 A1 Jul. 29, 2004

(30) Foreign Application Priority Data

Nov. 25, 2002 (DE) .......................................... 102 55 462

(51) Int. Cl.$^7$ ............................................. H01L 23/02
(52) U.S. Cl. ..................................... 174/52.5; 257/698
(58) Field of Search ............................. 174/52.4, 52.5; 257/698, 708, 709

(56) References Cited

U.S. PATENT DOCUMENTS

| | | | | |
|---|---|---|---|---|
| 3,379,823 A | * | 4/1968 | Loose ..................... | 174/50.61 |
| 3,726,987 A | * | 4/1973 | Pryor et al. .............. | 174/50.61 |
| 4,167,647 A | * | 9/1979 | Salera ..................... | 174/52.4 |
| 4,382,327 A | * | 5/1983 | Bardens et al. ........... | 29/832 |
| 4,514,587 A | * | 4/1985 | Van Dyk Soerewyn .... | 174/52.5 |
| 4,706,106 A | * | 11/1987 | Shiba et al. .............. | 257/682 |
| 5,504,349 A | | 4/1996 | Yoshino | |
| 6,034,424 A | * | 3/2000 | Fujimura et al. .......... | 257/696 |
| 6,091,022 A | * | 7/2000 | Bodin ..................... | 174/52.5 |

FOREIGN PATENT DOCUMENTS

| | | |
|---|---|---|
| DE | 3248695 | 7/1984 |
| JP | 01059972 A | 3/1989 |

* cited by examiner

Primary Examiner—Hung V. Ngo
(74) Attorney, Agent, or Firm—Eschweller & Associates, LLC

(57) ABSTRACT

The invention relates to an electrical arrangement having a mount device with at least one conductor track, having an electrical component that is mounted on the mount device and is electrically connected to the at least one conductor track. The arrangement further includes a housing base plate on which the mount device is mounted and through which at least one contact-making pin extends, with the at least one contact-making pin being electrically connected to the at least one conductor track. In order to improve the frequency response of the arrangement, the invention provides for the at least one contact-making pin to touch the mount device and, in the area of the touching point, for a connection without any bonding wire to be provided between the at least one contact-making pin and the at least one conductor track on the mount device.

33 Claims, 3 Drawing Sheets

ELECTRICAL ARRANGEMENT AND METHOD FOR PRODUCING AN ELECTRICAL ARRANGEMENT

REFERENCE TO RELATED APPLICATIONS

This application claims the benefit of the priority date of German application DE 102 55 462.5, filed on Nov. 25, 2002, the contents of which are herein incorporated by reference in their entirety.

FIELD OF THE INVENTION

The present invention is directed to optical components, and more particularly to an optical system arrangement and a method for producing such an optical arrangement.

BACKGROUND OF THE INVENTION

Optoelectronic components, in particular lasers and photodetectors, are frequently accommodated or "housed" in so-called TO housings. The signals are input and output via contact-making pins that are passed through the housing and are connected to the components by means of bonding wires. The bushings for the contact-making pins are glazed and are routed coaxially, thus offering hermetic encapsulation for the sensitive optoelectronic components. Furthermore, the TO housing shape is relatively compact and has a low price, since it is a standard product that is mass-produced. In particular, lasers that are accommodated in TO46 housings have become established as a type of standard product for optical data transmission over short and medium distances in the range up to 2.5 Gigabits per second.

The data rates for optical telecommunications are, however, currently in the range of 10 Gigabits per second or more, so that the said TO housings can no longer be used directly for optoelectronic components. Lasers and photodetectors with data rates of 10 Gigabits per second or more are thus nowadays offered in special housings composed of metal or ceramic. These housings are optimized for high frequencies and offer the capability to integrate further electronics, such as driver components or preamplifier components in them. However, housings such as these are manufactured only in very small volumes, so that the prices for such housings—also referred to as hybrid housings—are considerably greater than the cost of a TO housing.

SUMMARY OF THE INVENTION

One aspect of the invention is based on the object of improving the electrical characteristics of an electrical arrangement of the type described initially. This includes, in particular, the aims of achieving a better frequency response, for example a higher cut-off frequency, than in the case of the already known electrical arrangements.

Accordingly, the invention provides for at least one of the contact-making pins which are passed through the housing to touch the mount device, and, in the area of the touching point, for a connection without any bonding wires to be provided between this at least one contact-making pin and at least one conductor track on the mount device.

One major advantage of the electrical arrangement according to the invention is that its frequency response is better than that of the already known electrical arrangements. The electrical arrangement according to the invention can thus be used to achieve a higher cut-off frequency since no bonding wire connection for electrical contact making is required between the contact-making pin and the mount device; this is because, in the arrangement according to the invention, the mount device and the at least one contact-making pin touch one another such that an electrical connection without bonding wires is possible in the area of the touching point. Bonding wires, such as those that are required for making contact between the mount device and the contact-making pin in the already known electrical arrangements, always have additional line inductances, which decrease the cut-off frequency. This is where the invention comes into play, by dispensing with bonding wires for making electrical contact between the contact-making pin and the mount device; according to the invention, this is achieved by the mount device being mounted on the housing base plate of the electrical arrangement such that it touches at least one contact-making pin which is passed through and allows an electrical connection without any bonding wires.

A further advantageous development of the arrangement according to the invention provides for the mount device to have an edge recess, whose contour is matched to the contour of the at least one contact-making pin, in the area of the touching point. The matching of the contours of the edge recess and of the contact-making pin result in a particularly large-area electrical connection between the electrical contact-making pin and the mount device, so that a particularly low-impedance and secure electrical connection is possible between the contact-making pin and the conductor track on the mount device.

In this context, it is regarded as being advantageous for the recess to be semicircular, because a semicircular recess on the one hand allows very simple adjustment and mounting of the mount device on the housing base plate and, on the other hand, it nevertheless allows a good electrical contact-making capability between the contact-making pin and the mount device.

In order to achieve a particularly large-area and thus low-impedance electrical contact between the mount device and the contact-making pin, it is regarded as being advantageous for the mount device to be metallized and/or to have a conductive contact-making layer in the area of the edge recess.

Another advantageous refinement of the electrical arrangement according to the invention provides for the mount device to have a contact-making hole in the area of the touching point, through which contact-making hole the at least one contact-making pin is passed. In contrast to the advantageous refinement of the invention as described above, in which the touching point between the contact-making pin and the mount device is located in the edge area of the mount device, the touching point in this refinement of the electrical arrangement is arranged in the internal area of the mount device.

In order to achieve a particularly large-area and thus low-impedance electrical connection between the contact-making pin and the mount device, it is in this context regarded as being advantageous for the inner area of the contact-making hole to be metallized and/or to have a conductive layer.

The electrical contact between the at least one conductor track on the mount device and the at least one contact-making pin can be made particularly easily and thus advantageously by means, for example, of conductive adhesive. However, instead of this, it is also possible to solder the at least one contact-making pin and the at least one conductor track on the mount device to one another in the area of the touching point.

Soldering between the at least one contact-making pin and the at least one printed circuit board on the mount device can be achieved, for example, by means of a solder ball or solder platelet, either of which is applied to the at least one contact-making pin, and thus also to the at least one conductor track, in the area of the touching point.

As already indicated above in conjunction with the already known prior art, particularly stringent requirements for cut-off frequencies occur especially in the area of optoelectronics. It is thus regarded as being advantageous for the electrical component to be an electro-optical component, in particular an optical transmitting and/or receiving element. The electrical component may thus, for example, be a laser or a photodetector.

With regard to the at least one contact-making pin passing through the housing base plate, it is regarded as advantageous for the bushing to be a glazed coaxial bushing. Glazed coaxial bushings have the advantage that they allow the housing to be hermetically sealed.

Apart from this, it is regarded as being advantageous for the housing of the electrical arrangement to be a TO housing, in particular a TO46 housing, since housings such as these are available at very low cost since they are mass-produced, and, in consequence, this also reduces the costs of the overall electrical arrangement.

The mount device may advantageously be formed by a circuit mount.

The circuit mount is advantageously composed of silicon, of ceramic, of an organic material or of a metal that is provided with an isolation layer. Both metal and silicon have particularly high thermal conductivity, so that these materials allow the heat that is produced by the electrical component to be thermally dissipated particularly well.

Particularly high electrical cut-off frequencies can be achieved by removing or replacing, as much as possible, all the avoidable bonding wire connections; it is thus regarded as being advantageous for an electrical component having at least two connections for each of these connections to be electrically connected to a conductor track. In addition, it is advantageous for the mount device to touch at least two contact-making pins, which are routed to the exterior, and for the connection between the two conductor tracks and between the two contact-making pins to have no bonding wires.

In order to achieve as high a cut-off frequency as possible for the electrical arrangement, another aspect of the invention provides for the mount device to be mounted on a housing base plate such that the mount device touches at least one contact-making pin, which is routed to the exterior. The invention further provides, in the area of the touching point, for a connection without any bonding wires to be produced between the at least one contact-making pin and the at least one conductor track on the mount device.

With regard to the advantages of the method according to the invention, and with regard to the advantages of the advantageous refinements of the method according to the invention, reference is made to the above statements relating to the electrical arrangement according to the invention, since the advantages of the method according to the invention essentially correspond to the advantages of the arrangement according to the invention.

BRIEF DESCRIPTION OF THE DRAWINGS

In order to explain the invention.

DETAILED DESCRIPTION OF THE INVENTION

Figure 1:
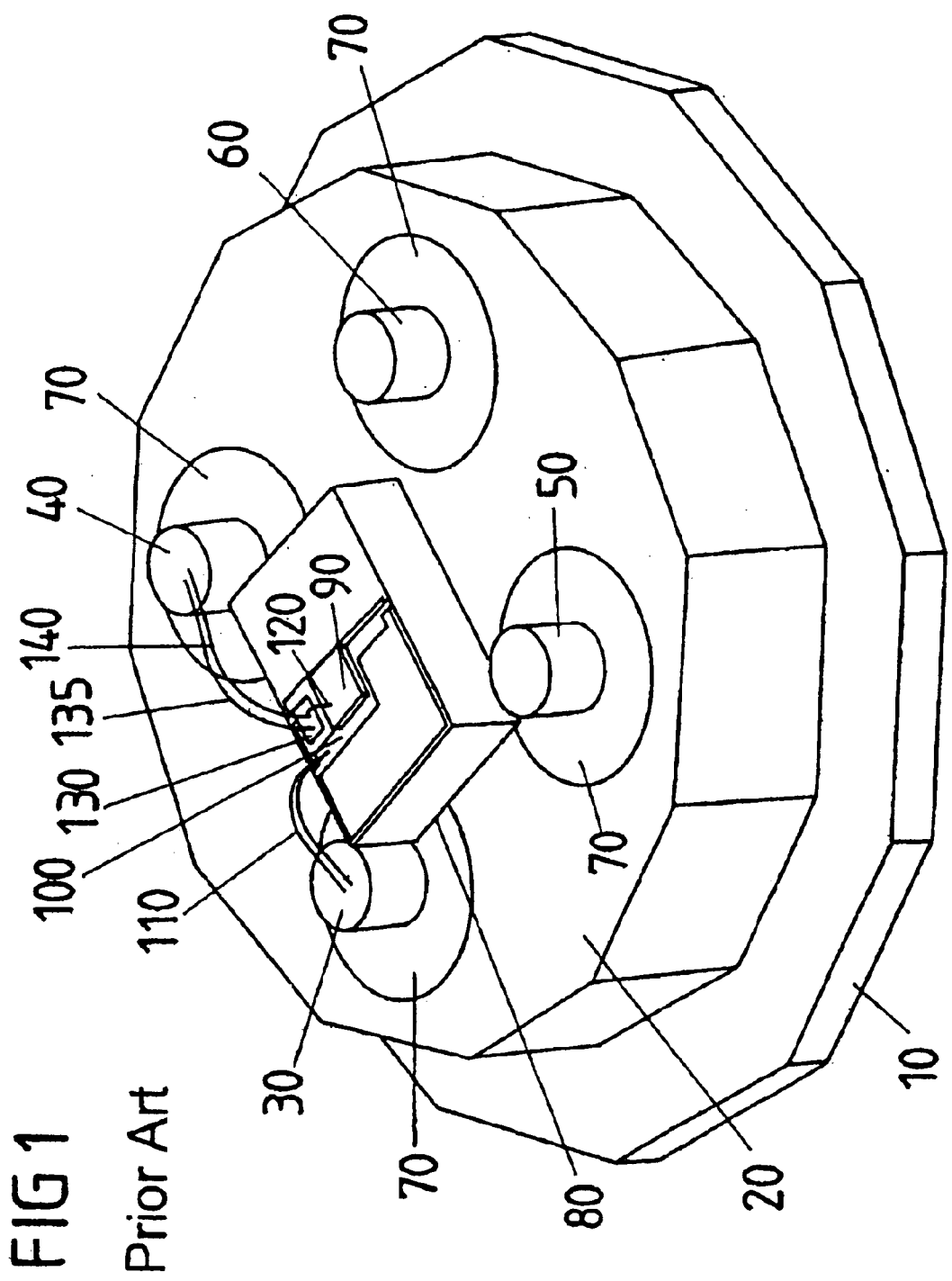
FIG. 1 shows an electrical arrangement according to the prior art.

FIG. 1 shows an electrical arrangement according to the prior art, which has a TO46 housing 10 with a housing base plate 20. Four contact-making pins are passed through the housing base plate 20 and thus through the TO housing 10: a contact-making pin 30, a further contact-making pin 40 and additional contact-making pins 50 and 60. The four contact-making pins 30, 40, 50 and 60 are each passed by means of a coaxial glazed bushing 70 through the housing base plate 20 and through the TO housing 10 to the exterior, thus resulting in the TO housing 10 being hermetically sealed.

A mount device 80 is mounted on the housing base plate 20. A laser 90 is mounted as an electrical component on this mount device 80. One connection of the laser 90 is connected to an electrical conductor track 100 on the mount device 80. The conductor track 100 is also connected by means of a bonding wire 110 to one contact-making pin 30.

A further connection of the laser 90 is connected by means of a further bonding wire 120 to an additional conductor track 130. This additional conductor track 130 is connected via a third bonding wire 135 and via a fourth bonding wire 140 to the further contact-making pin 40.

Thus, as can be seen from FIG. 1, the respective bonding wires 110, 120, 135 and 140 are provided for the electrical connection between the two contact-making pins 30 and 40 and the conductor tracks 100 and 130 on the mount device 80, and the laser 90 respectively. These four bonding wires have line inductances that have a very poor transmission response, particularly at high frequencies. The cut-off frequency of the electrical arrangement shown in FIG. 1 is reduced considerably by these bonding wires, so that maximum data rates of 8 to 9 Gigabits per second can be achieved with the electrical arrangement shown in FIG. 1.

Figure 2:
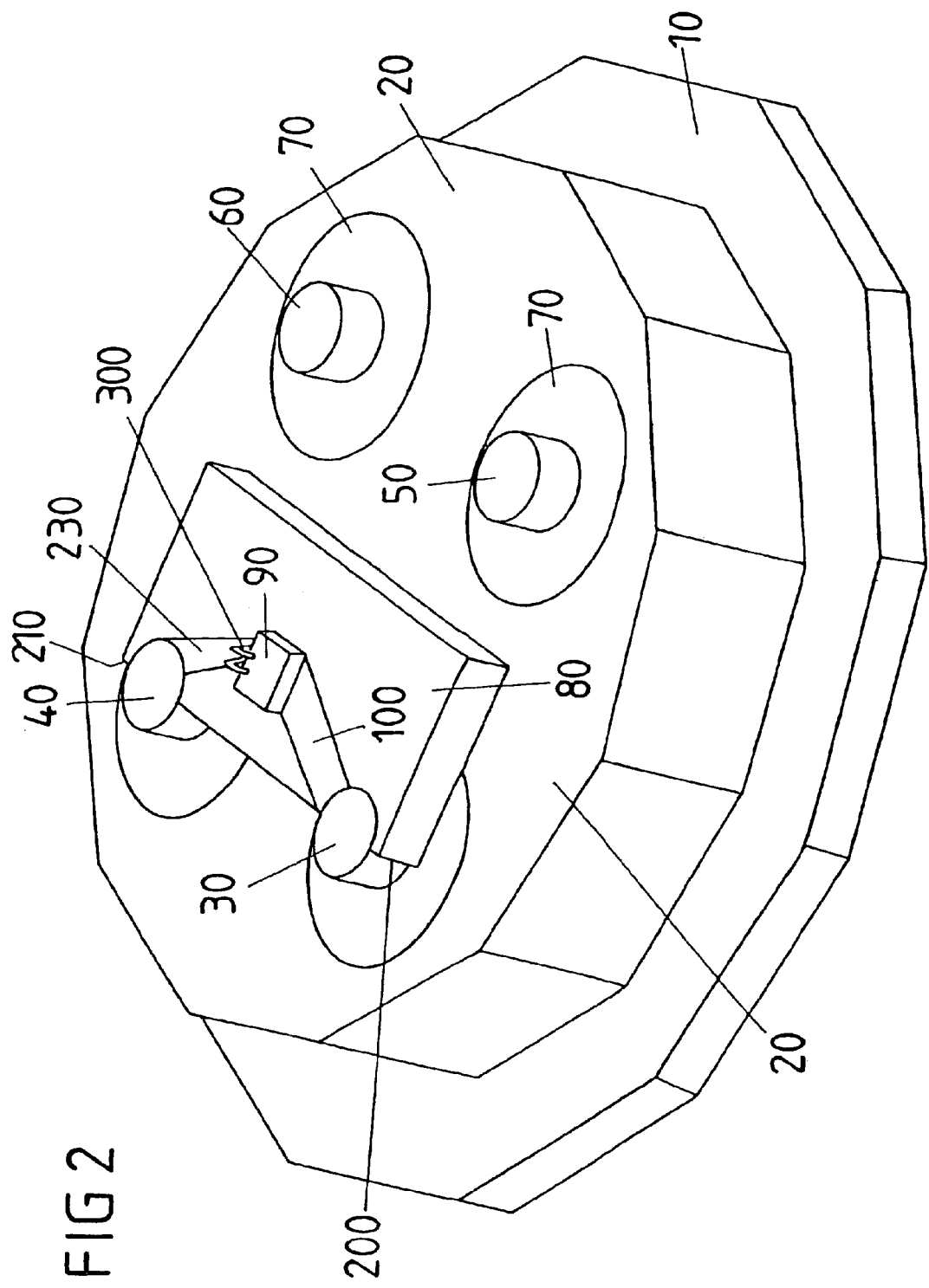
FIG. 2 shows an exemplary embodiment of an electrical arrangement according to the invention, which is advantageously produced using the method according to the invention, as described above.

FIG. 2 shows an exemplary embodiment of an electrical arrangement according to the invention. In this case, FIG. 2 uses the same reference symbols for all those components that have already been explained in conjunction with the electrical arrangement shown in FIG. 1.

FIG. 2 shows the TO housing 10 on whose housing base plate 20 the mount device 80 is mounted. The laser 90 is located as an electrical component on the mount device 80. To this extent, the configuration of the electrical arrangement shown in FIG. 2 corresponds to the configuration of the electrical arrangement shown in FIG. 1.

A major difference between the electrical arrangement shown in FIG. 1 and the electrical arrangement shown in FIG. 2 is that no bonding wires are required for the electrical connection between the two contact-making pins 30 and 40 and the conductor tracks on the mount device 80. The electrical connection between one contact-making pin 30 and one conductor track 100 in the electrical arrangement shown in FIG. 2 is thus ensured by the mount device 80 touching a contact-making pin 30 at the edge. For this purpose, the mount device 80 has a semicircular recess 200, whose dimensions are such that approximately half of one contact-making pin 30 can engage in the edge recess 200 in the mount device 80.

The edge recess 200 is in this case metallized so that an electrical connection is produced between that contact-making pin 30 and the edge area of the mount device 80. The one conductor track 100 is in this case electrically connected to the edge metallization of the recess 200, so that this results in an electrical contact between that conductor track 100 and that contact-making pin 30.

A corresponding situation applies to the connection of the further contact-making pin 40. This is because the mount device 80 has a further semicircular recess 210, whose dimensions are such that approximately half of the further contact-making pin 40 can engage the recess 210 in the mount device 80. The further recess 210 is likewise metallized at the edge, so that an electrical contact is formed between the edge of the further recess 210 and the further contact-making pin 40. Furthermore, there is a further conductor track 230 on the mount device 80, which is electrically connected to the metallized edge area of the further recess 210. The further conductor track 230 is thus also electrically connected to the further contact-making pin 40, without any need for a bonding wire.

FIG. 2 thus shows that only very short bonding wires 300 are required to make contact with the laser 90, by means of which, specifically, the further connection of the laser 90 is connected to the further conductor track 230.

Thus, in the arrangement shown in FIG. 2, no bonding wires are required for making contact with the two contact-making pins 30 and 40. This avoidance of bonding wires, that is to say in particular the bonding wires 110, 135 and 140 shown in FIG. 1, is possible because the electrical contact between the two contact-making pins 30 and 40 is ensured by the mount device 80 and the two contact-making pins 30 and 40 touching at the edge.

Overall, the electrical arrangement shown in FIG. 2 thus has at least two fewer bonding wires than the electrical arrangement shown in FIG. 1 since, specifically, no bonding wires are required for the electrical connection between the contact-making pins 30 and 40 and the associated conductor tracks 100 and 230 on the mount device 80.

The electrical arrangement shown in FIG. 2 thus allows optoelectronic components to be integrated in a TO housing and at the same time to achieve data rates of 10 Gigabits per second or more, because the bonding wires which limit the frequency have been removed.

The electrical contact and the electrical connection between the two contact-making pins 30 and 40 and the edge metalization on the mount device 80, and thus to the two conductor tracks 100 and 230 on the mount device 80 can be produced by means of a soldering process or by means of conductive adhesive bonding.

A soldered joint may, for example, be implemented such that a small solder ball is in each case applied to each of the two contact-making pins 30 and 40.

The mount device 80 may be a circuit mount. The mount device 80 may, for example, be formed from silicon or ceramic, or from an organic material. Alternatively, the mount device 80 may also be composed of a metal that is provided with an isolation layer.

Figure 3:
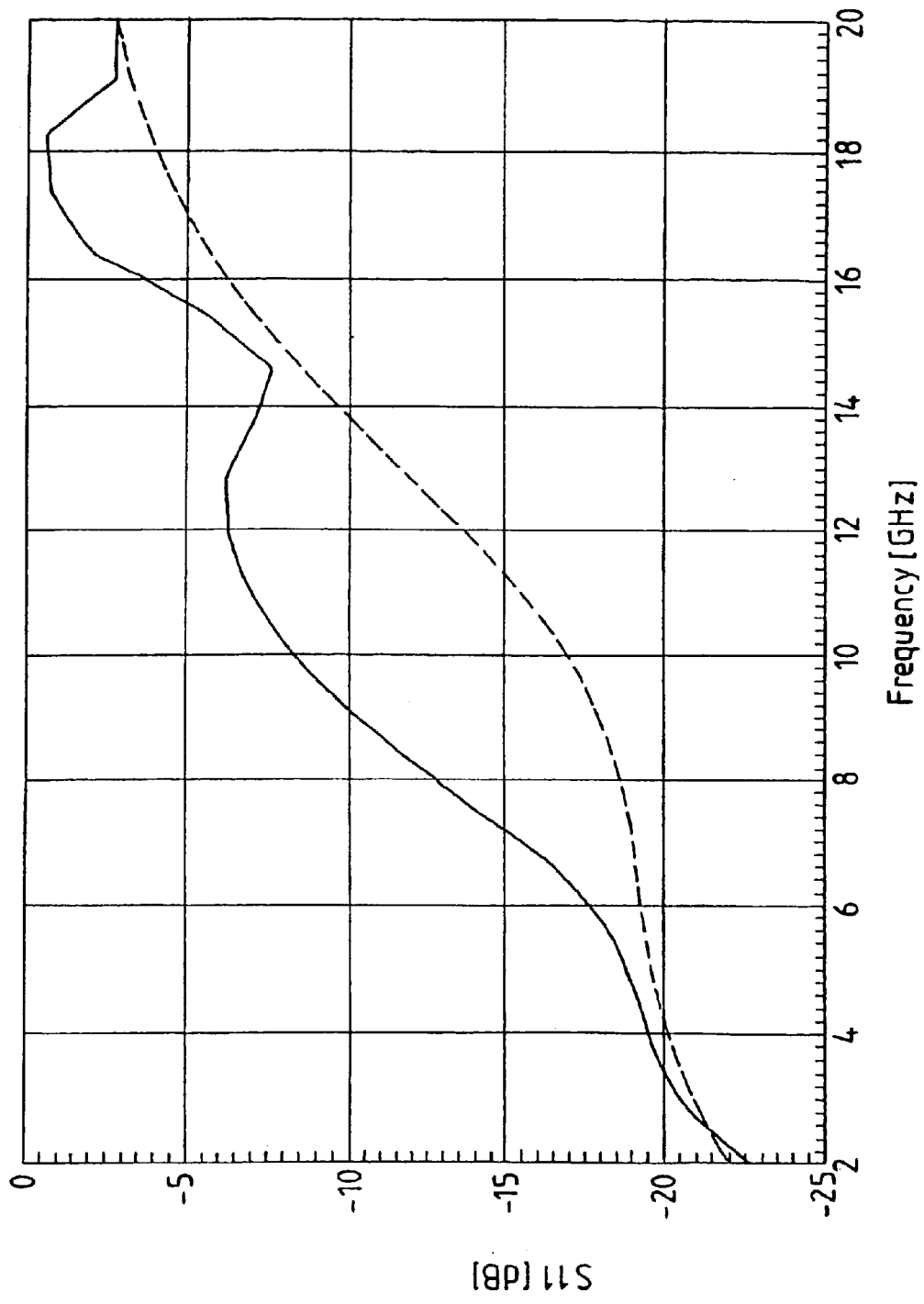
FIG. 3 shows the frequency response of the electrical arrangement shown in FIG. 2, compared to the frequency response of the electrical arrangement shown in FIG. 1.

FIG. 3 shows the frequency response of the electrical arrangement shown in FIG. 2, compared to the frequency response of the electrical arrangement shown in FIG. 1. Specifically, FIG. 3 shows the simulated reflection characteristic (S11) (Y-axis) of the two arrangements. As can be seen, the arrangement shown in FIG. 2 can achieve considerably higher cut-off frequencies than the arrangement shown in FIG. 1.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

List of reference symbols

| | |
|---|---|
| 10 | TO46 housing |
| 20 | Housing base plate |
| 30 | A contact-making pin |
| 40 | A further contact-making pin |
| 50, 60 | Additional contact-making pins |
| 70 | Coaxial glazed bushings |
| 80 | Mount device |
| 90 | Laser |
| 100 | A conductor track |
| 110 | Bonding wire |
| 120 | Further bonding wire |
| 130 | Additional conductor track |
| 135 | Third bonding wire |
| 140 | Fourth bonding wire |
| 200 | Recess |
| 210 | Further recess |
| 230 | Further conductor track |
| 300 | Bonding wires |

What is claimed is:

1. An electrical arrangement, comprising:
   a mount device having at least one conductor track;
   an electrical component mounted on the mount device and electrically connected to the at least one conductor track; and
   a housing base plate on which the mount device is mounted;
   at least one contact-making pin electrically connected to the at least one conductor track, wherein the at least one contact-making pin extends through the housing base plate,
   wherein the at least one contact-making pin touches the mount device, thereby defining a touching point, and in the area of the touching point, a connection without any bonding wire is provided between the at least one contact-making pin and the at least one conductor track on the mount device.

2. The electrical arrangement of claim 1, wherein in the area of the touching point, the mount device comprises at least one recess at an edge thereof, and wherein a contour of the at least one recess corresponds to a contour of the at least one contact-making pin.

3. The electrical arrangement of claim 2, wherein the recess of the mount device is semicircular.

4. The electrical arrangement of claim 2, wherein the mount device is metallized or has a conductive layer in the area of the edge recess.

5. The electrical arrangement of claim 1, wherein the mount device comprises a structure defining a contact-making hole through which the at least one contact-making pin extends.

6. The electrical arrangement of claim 5, wherein the mount device is metallized or has a conductive layer in an area of the mount device associated with the contact-making hole.

7. The electrical arrangement of claim 1, wherein a conductive adhesive is disposed between the mount device and the at least one contact-making pin.

8. The electrical arrangement of claim 1, wherein the at least one contact-making pin and the at least one conductor track are soldered to one another in the area of the touching point.

9. The electrical arrangement of claim 8, wherein the soldering is provided by means of a solder ball or a solder platelet that is applied to the at least one contact-making pin in the area of the touching point.

10. The electrical arrangement of claim 1, wherein the electrical component comprises an electrooptical component including one of an optical transmitting element or an optical receiving element, respectively.

11. The electrical arrangement of claim 10, wherein the optical transmitting element comprises a laser and the optical receiving element comprises a photodetector.

12. The electrical arrangement of claim 1, wherein at least one of the bushings for the at least one contact-making pin comprises a glazed coaxial bushing.

13. The electrical arrangement of claim 1, wherein the housing base plate is part of a TO46 housing.

14. The electrical arrangement of claim 1, wherein the mount device comprises a circuit mount.

15. The electrical arrangement of claim 14, wherein the circuit mount is composed of silicon, ceramic, an organic material, or a metal provided with an isolation layer.

16. The electrical arrangement of claim 1, wherein the electrical component comprises at least two connections that are electrically connected to a respective conductor track, and wherein the mount device touches at least two contact-making pins that extend through the housing base plate such that the contact-making pins are connected to a respective conductor track.

17. A method for producing an electrical arrangement, comprising:
  applying at least one conductor track to a mount device;
  mounting an electrical component on the mount device, wherein the electrical component is in electrical communication with the at least one conductor track;
  mounting the mount device on a housing base plate of a housing having at least one contact-making pin extending therethrough; and
  coupling the electrical component to the at least one contact-making pin,
  wherein the mount device is mounted on the housing base plate such that the mount device touches the at least one contact-making pin, thereby defining a touching point, and
  wherein in the area of the touching point, a connection without any bonding wire is produced between the at least one contact-making pin and the at least one conductor track of the mount device.

18. The method of claim 17, wherein the mount device comprises an edge recess in the area of the touching point, and wherein a contour of the edge recess corresponds to a contour of the at least one contact-making pin.

19. The method of claim 18, wherein the edge recess is semicircular.

20. The method of claim 18, further comprising metallizing or providing a conductive layer in the area of the edge recess of the mount device.

21. The method of claim 17, wherein the mount device comprises a contact-making hole extending therethrough, through which the at least one contact-making pin extends.

22. The method of claim 21, further comprising metallizing or providing a conductive layer in the area of the contact-making hole of the mount device.

23. The method of claim 17, further comprising disposing a conductive adhesive between the mount device and the at least one contact-making pin.

24. The method of claim 17, further comprising soldering together the at least one contact-making pin and the at least one conductor track in the area of the touching point.

25. The method of claim 24, wherein soldering comprises applying a solder ball or a solder platelet to the at least one contact-making pin in the area of the touching point.

26. The method of claim 17, wherein the electrical component comprises an electrooptical component.

27. The method of claim 26, wherein the electrooptical component comprises an optical transmitting element or an optical receiving element, respectively.

28. The method of claim 27, wherein the optical transmitting element comprises a laser or the optical receiving element comprises a photodetector, respectively, on which the mount device is mounted.

29. The method of claim 17, further comprising providing a glazed coaxial bushing about the at least one contact-making pin.

30. The method of claim 17, wherein the housing comprises a TO46 housing.

31. The method of claim 17, wherein the mount device comprises a circuit mount.

32. The method of claim 31, wherein the circuit mount is composed of silicon, ceramic, an organic material or a metal that is provided with an isolation layer.

33. The method of claim 17, wherein the electrical component has at least two connections that are electrically connected to a respective conductor track, and wherein the mount device is mounted on the housing base plate such that the mount device touches at least two contact-making pins that extend through the housing base plate and connect to a respective conductor track.

* * * * *